(12) United States Patent
Humphrey

(10) Patent No.: US 6,337,027 B1
(45) Date of Patent: Jan. 8, 2002

(54) MICROELECTROMECHANICAL DEVICE MANUFACTURING PROCESS

(75) Inventor: Kurt D. Humphrey, Colorado Springs, CA (US)

(73) Assignee: Rockwell Science Center, LLC, Thousand Oaks, CA (US)

(*) Notice: Subject to any disclaimer, the term of this patent is extended or adjusted under 35 U.S.C. 154(b) by 0 days.

(21) Appl. No.: 09/410,166

(22) Filed: Sep. 30, 1999

(51) Int. Cl.$^7$ ............................ H01L 21/00; B44C 1/22
(52) U.S. Cl. ............................ 216/2; 216/33; 216/84; 216/92; 438/748
(58) Field of Search ............................ 216/2, 13, 33, 216/41, 59, 67, 79, 84, 92, 97, 99, 100; 438/14, 719, 735, 745, 748; 134/1, 3, 27, 29, 34

(56) References Cited

U.S. PATENT DOCUMENTS 5,127,984 A * 7/1992 Hua et al. .................. 438/748
5,578,976 A 11/1996 Yao
6,174,820 B1 * 1/2001 Habermehl et al. ......... 216/2 X

OTHER PUBLICATIONS

Not Known, "Mallinckrodt Material Safety Data—Cavity Etch R–51," (Nov. 9, 1992).

* cited by examiner

Primary Examiner—William A. Powell
(74) Attorney, Agent, or Firm—Craig E. Shinners

(57) ABSTRACT

The present invention relates to micro electromechanical systems (MEMS) devices and more specifically to a process for manufacturing MEMS devices having at least one suspended structural element. The present invention seeks to provide an improved method for manufacture of MEMS devices having improved safety and increased yield and throughput compared to conventional EDP immersion process techniques. MEMS devices are made using a modified dissolution process that removes, in a selective etch step, inactive silicon to release an active silicon device from a sacrificial substrate. The present invention uses a selective etchant in conjunction with a commercial spray acid processing tool to provide a dissolution process with improved throughput, improved repeatable and uniform etch rates and reduction in the number of processing steps and chemical containment for improved safety. When the etch process is complete, the solvent spray is turned off and a spray of de-ionized water is directed onto composite structure to remove residual solvent without causing suspended elements to adhere to the support substrate.

21 Claims, 4 Drawing Sheets

MICROELECTROMECHANICAL DEVICE MANUFACTURING PROCESS

BACKGROUND OF THE INVENTION (1) Field of the Invention

The present invention relates to micro electromechanical systems (MEMS) devices and more particularly to a manufacturing process for manufacture of MEMS devices and application of such MEMS devices for a particular use.

(2) Description of Related Art

Micro electromechanical MEMS devices are free-standing structural elements integrated on a substrate. MEMS devices are useful for many sensor or actuator applications such as electrical signal isolators, micro switches, or tuning fork gyroscopes, by way of example. A typical MEMS device has structural elements such as cantilevered beams, suspended platforms, capacitor plates, or other elements displaced from the supporting substrate. The size of these structural elements is typically on the order of millimeters.

The manufacturing process for MEMS devices shares many of the same processing steps employed in the manufacture of integrated circuits, particularly patterning and etching steps. Unlike surface MEMS devices or LIGA devices, a typical bulk MEMS device includes a base substrate that supports the structural element and a sacrificial silicon substrate from which the structural element is obtained. The base substrate may be a Pyrex glass substrate having electrodes and conductive traces deposited thereon. The base substrate may also be etched to include a plurality of pedestals for anchoring the structural elements above the surface of the glass substrate.

The sacrificial silicon substrate has a doped epilayer in which an image of the MEMS device is imprinted using well-known semiconductor lithographic imaging techniques. Portions of the epilayer are then selectively etched using a plasma dry etch, to define the structural elements. The sacrificial silicon substrate and the glass substrate are then aligned and anodically bonded together to form a composite structure with the structural elements of the MEMS device mounted on the pedestals.

Unique to the process for manufacturing bulk MEMS devices, large amounts of sacrificial silicon substrate must then be removed to release the structural elements of the MEMS device. One process for removing the sacrificial portions of the silicon substrate is referred to as a wafer dissolution process. In the dissolution process, the composite structure is immersed in a container of heated solvent to remove the sacrificial silicon substrate. One solvent capable of removing the silicon is a mixture of ethylene diamine and pyrocathecol, commonly referred to as EDP. The doped epi layer has a significantly lower etch rate in EDP compared to the undoped silicon substrate so the silicon substrate is etched at a much faster rate than either the epi or glass substrate. The dissolution method requires that the composite structure remain immersed in the solvent for several hours, depending on etch conditions and substrate size or diameter, to completely remove the sacrificial silicon substrate. Once the sacrificial silicon is removed, the structural elements defined in the epi layer are left suspended above the substrate, but attached to the pedestals.

During the immersion period the solvent is agitated to bathe the composite structure and maintain a high concentration of active solvent in contact with the structure. Unfortunately, the dissolution or dissolving of the substrate in the toxic solvent presents significant environmental and manufacturing problems. For example, since the agitated solvent is heated to about 100° C. toxic and corrosive fumes are generated. Thus, containment of the fumes is a necessity for the safety of the manufacturing personnel and provisions must be made to safely vent the fumes from the manufacturing area in a manner that is consistent with environmental and safety concerns. Also, since the composite structure is fairly large, a significant volume of the solvent is required to completely submerge the composite structure. After processing, the spent solvent must be disposed. Clearly, what is needed is a manufacturing method that eliminates the generation of toxic fumes and that minimizes the amount of solvent that is necessary to remove the sacrificial silicon substrate and release the structural elements of the MEMS device.

Another problem with the solvent used in the dissolution method is that endpoint detection requires a visual analysis but visual detection is not possible while the composite structure is immersed because the EDP solvent, in large quantities, is highly opaque. Further, characterizing the etch rate is difficult since the etch rate varies as a function of the concentration of the unspent solvent. Therefore, the time to completely remove the sacrificial substrate will increase as a function of the amount of silicon previously etched. For these reasons, it is necessary for an operator to periodically remove the composite structure from the solvent to visually monitor the etch process. However, this is a noxious process that requires great care on the part of the operator and increases the probability of injury to the operator. Moreover, determining the endpoint of the etch process must be done very quickly before spent solvent coating the partially etched device forms precipitates on the device surface. If the inspection is not performed very rapidly, the precipitates will render the device irreparably damaged and the entire wafer will have to be scrapped. To avoid the formation of precipitates, it is common for the composite structure to be left in the solvent for a longer than optimal period of time before the inspection is performed. Although the risk of precipitate formation is reduced, the extended etch time often results in an over-etched MEMS device that will not function properly. What is needed is a process that permits timely detection of the etch process so that high volumes of composite structures may be completely etched (but not over-etched) regardless of the concentration of the solvent.

After the etch process is complete, the etched composite structure must be cleaned to remove residual solvent adhering to the composite structure. If the solvent is not quickly removed, crystal residue will form as the solvent evaporates. The residual contamination could render the device defective. Accordingly, the dissolution process also includes a cleaning process. The cleaning process requires that the composite structure be immersed in a vat of hot de-ionized (DI) water heated to about 100° C. This immersion process subjects the operator to the risk of potential injury from scalding water if the composite structure is not carefully handled.

After the cleaning process, the suspended structural elements are often found to adhere to the glass substrate due to surface tension or stiction (static friction). To overcome the stiction, the dissolution process further includes a vacuum release step where the composite structure is place in a vacuum chamber in an attempt to separate the suspended element from the glass substrate. Often, the vacuum step is not successful, affecting device yields. It has been found that minimizing the amount of the surface area of the glass substrate that could contact the suspended elements, stiction yield loss can be further reduced. For this reason, the prior art dissolution process includes process steps where a plurality of metal stand-offs are formed in the metal under the suspended structural elements. The stand-offs reduce the amount of surface area of the glass substrate that can come in contact with the suspended structural element. Thus, after the DI water clean, the composite structure is immediately placed in the vacuum chamber to rapidly dry and separate the suspended structural element from the electrode since these elements will typically adhere to the glass substrate after the immersion steps. If there is significant delay in removal of the Dl water, the stiction force will permanently maintain the suspended portion in contact with the electrode rendering the MEMS device defective. Although providing the stand-offs require additional processing steps, the improvement in manufacturing yields typically justify such steps. The stand-offs further increase the yield obtained from the vacuum release step, it being noted that neither vacuum release nor stand-offs alone are sufficient to overcome the stiction forces.

The above described dissolution process has poor yield due to poor process control, is very expensive and slow. Further, the process is dangerous in that operators are exposed to toxic fumes and hot liquids. While the above described process is acceptable for research and development or manufacturing small quantities of MEMS devices, scaling the process for large volumes is cost prohibitive. Clearly, what is needed is a process that has improved process control, improved yield, and minimizes the quantities of toxic solvent produced as a by-product of the manufacturing process. Accordingly, what is needed is a process that is controllable, safe and inexpensive for manufacturing high volume of MEMS devices.

SUMMARY OF THE INVENTION

The present invention relates to micro electromechanical (MEMS) devices and more specifically to a process for manufacturing MEMS devices. The present invention is a modified dissolution process that removes, in a selective etch step, inactive silicon to release suspended structural elements from a sacrificial silicon substrate using a spray of etchant. Stiction forces are minimized by rapidly switching from the etchant spray to a hot de-ionized (DI) water spray. The use of the two step spray process is critical to the improvements of the present invention.

In accordance with the present invention, the MEMS device includes a Pyrex glass substrate and a sacrificial silicon substrate. The glass substrate is patterned with electrodes, conductive traces and a plurality of pedestals. The sacrificial silicon substrate has a doped epi layer that is selectively etched using a plasma dry etch, to define the suspended structural elements of the MEMS device. The sacrificial silicon substrate and the glass substrate are aligned and anodically bonded into a composite structure with the structural elements of the MEMS device mounted on the pedestals.

A portion of the sacrificial silicon substrate is removed using wet etch of potassium hydroxide (KOH) or backside grind to get to a desired thickness. A combination of both back-side grinding and wet etching may also be used to thin the sacrificial substrate. The remaining portion of the sacrificial silicon substrate is then removed either completely or to an amount sufficient to release the structural element. This removal step uses a commercially available spray acid processing tool. The tool provides a closed chamber in which a one or more composite structures are positioned.

During the dissolution step, an etchant is sprayed onto the composite structure from a plurality of nozzles. The nozzles are positioned to direct the etchant onto the composite structure at a rate sufficient to form a sheeting action on the composite structure. As active etchant is sprayed, spent acid is recovered either for subsequent re-use or for disposal. The progress of the etch process is observable through the windows of the tool since the etchant spray coats the composite structure with a transparent thin sheeting. The etch process is readily terminated since concentration of the etchant is more predictable than the immersion process described above. Advantageously, the present invention does not relay on a mixing action to remove spent solvent from the silicon wafer but rather encompasses a dynamic system where the solvent is constantly circulated. The improved method of the present invention the efficient utilization of the solvent minimizes the amount of solvent required to remove the inactive silicon material from the composite device.

Immediately after the structural elements are released from the sacrificial silicon, a spray of heated DI water is sprayed through a plurality of nozzles onto the composite structure to remove residual etchant. Since the composite structure is cleaned in situ, delays due to transporting the composite structure to the DI water are minimized as is the likelihood that precipitates will form on the composite structure. Also, since the composite structure is not immersed in DI, the occurrence of suspended structural elements adhering to the glass substrate is substantially eliminated. Accordingly, the vacuum drying step of the prior art may be replaced by an air-dry process step.

The illustrated embodiment of the present invention provides improved throughput, improved repeatable and uniform etch rates, a reduction in the number of processing steps and chemical containment for improved safety compared to conventional dissolution processing techniques. Further, since the tool provides an enclosed chamber, escape of noxious fumes is significantly reduced.

Other advantages and aspects of the invention will become apparent to those skilled in the art from the detailed description of the invention which is presented by way of example and not as a limitation of the present invention.

DETAILED DESCRIPTION OF A PREFERRED EMBODIMENT

The present invention provides a method for manufacturing a MEMS device. In the following description, various MEMS devices are shown although it will be apparent to one of ordinary skill in the art that the present invention may be practiced without the specific structural or circuit details disclosed herein. In other instances, well known techniques or structural elements have not been shown in detail in order not to unnecessarily obscure the present invention. The present invention provides a method for the manufacture of MEMS devices with improved control of the manufacturing process. Advantageously, the present invention eliminates stiction forces that tend to cause MEMS structural elements to permanently adhere to the glass substrate as a result of the manufacturing process. The present invention also permits the efficient utilization of toxic etchant so as to minimize the risk posed to people and the environment.

Figure 1:
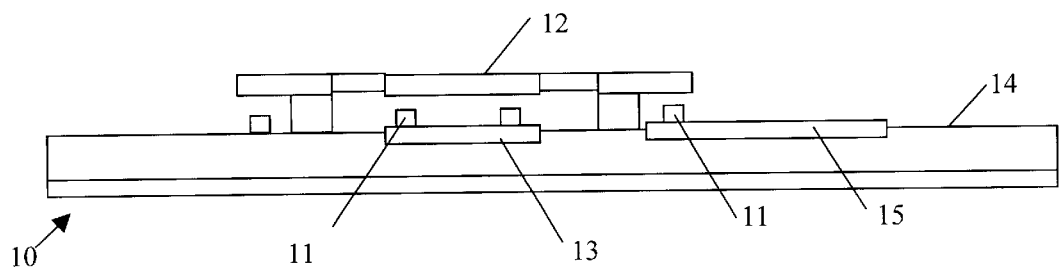
FIG. 1 illustrates a prior art MEMS device.

A representative illustration of a prior art MEMS device 10 manufactured using the immersion process described above is shown in FIG. 1. Of primary interest are the pluralities of stand-offs 11 that prevent suspended structural element 12 from coming into intimate contact with electrode 13 or the surface of substrate 14. Stand-offs 11 minimize the surface tension between electrode 13 and suspended structural element 12 created when water (or etchant) is evaporated. The stiction (static friction due to surface tension) is thus more readily overcome upon application of a vacuum because stand-offs 11 reduce the amount of surface area of the substrate 14 in contact with suspended portions of structural element 12. Stand-offs 11 are typically chemically inert metal (e.g. gold, platinum, etc.) deposits applied using a lift-off process prior to attaching the structural elements of the MEMS device to substrate 14. The stand-off material may be deposited on substrate 14, electrode 13 or on conductive trace 15. However, forming stand-offs 11 requires several process steps which increases manufacturing costs. Further, even with stand-offs 11, manufacturing yields suffer since the vacuum release often fails to overcome the stiction.

Figure 2:
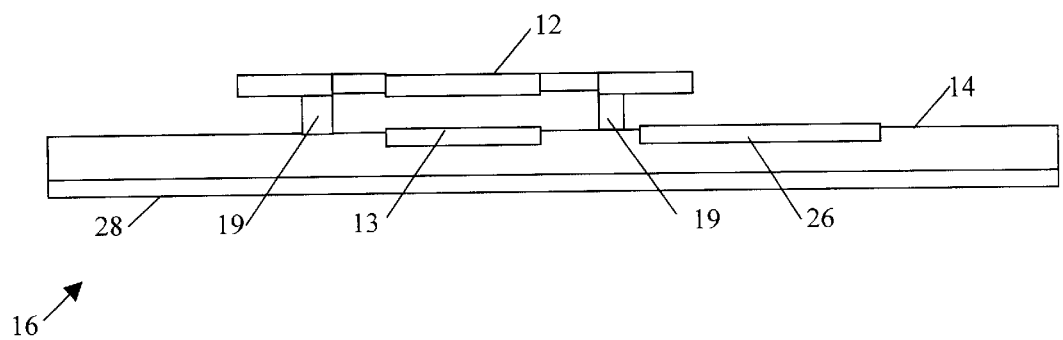
FIG. 2 illustrates one embodiment of a MEMS device manufactured in accordance with the present invention.

Referring now to FIG. 2, a representative MEMS device 16 manufactured in accordance with the present invention is illustrated. MEMS device 16 comprises a glass substrate 14. MEMS device 16 is preferably a Pyrex glass substrate although it should be apparent that other types of substrates may be used. For example, semiconductor or ceramic substrates may also be used with the present invention. Pedestals 19 provide a support mesa to which MEMS structural element 12 are attached and support structural element 12 at a spaced distance above substrate 14. Pedestals 19 are obtained by etching the surface of substrate 14 using semiconductor lithographic techniques. Once pedestals 19 are formed, the surface of substrate 14 may be selectively etched to form depressions or trenches in which metal is deposited and patterned to form electrodes or metal traces. Electrode 13 and metal trace 15 are deposited in the etched depressions so that each appears to be at least partially below the surface of substrate 14 when viewed from the side. Alternatively, electrode 13 and trace 15 may be deposited directly on substrate 14 so as to eliminate the trench-etch step. Finally, a layer of metal 28 is deposited on the backside of substrate 14 to aid in attachment of MEMS device 16 on a circuit board or other mounting structure. Common backside metal comprises an alloy of titanium, platinum and gold applied using a metal sputter evaporation system.

Figure 3:
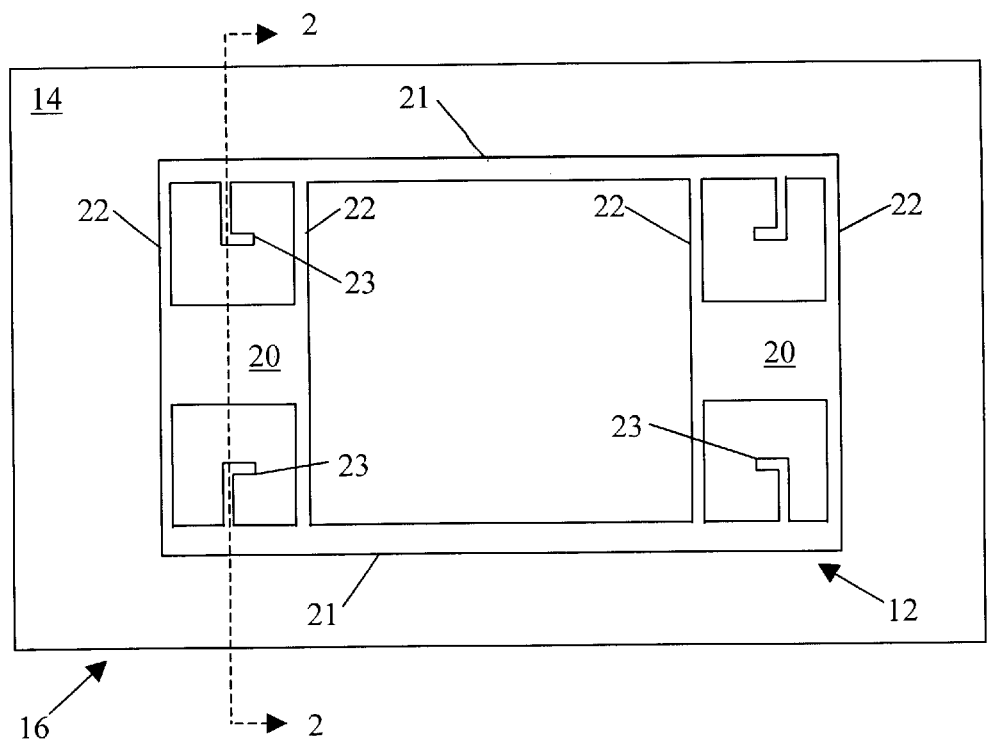
FIG. 3 illustrates a top view of the device of FIG. 2.

FIG. 3 is a schematic illustration of a top view of MEMS device 16 of FIG. 2. While the specific details of the suspended structural element are not essential to the invention, one possible structural element 12 is shown to illustrate the resulting structure that may be obtained with the novel processing sequence of the present invention. Structural element 12 includes a first and second suspended mass 20 positioned above substrate 14. Electrodes 13 or metal traces (FIG. 2) may be routed beneath mass 20 if required by a particular application. Each mass 20 is coupled to a pair of suspended base beams 21 by a pair of drive beams 22. Each base beam 21 is coupled to a pair of torsion beams 23. Torsion beams 23 terminate in an anchor portion giving the torsion beams an L-shape appearance. The anchor portion of torsion beams 23 rest on top of pedestals 19(see FIG. 2). Since pedestals 19 couple the structural element 12 to substrate 14, the only intended contact between substrate 14 and MEMS structural elements 12 should occur at the pedestals. However, if the MEMS device is immersed in liquid, as in the prior art dissolution method, the mass would most likely adhere to substrate 14 or electrode 13 since the surface area of mass 20 is quite large and the present invention does not include standoffs 11. However, with the present method, the structural element 12 is never immersed so the stiction problem is largely eliminated.

Figure 4:
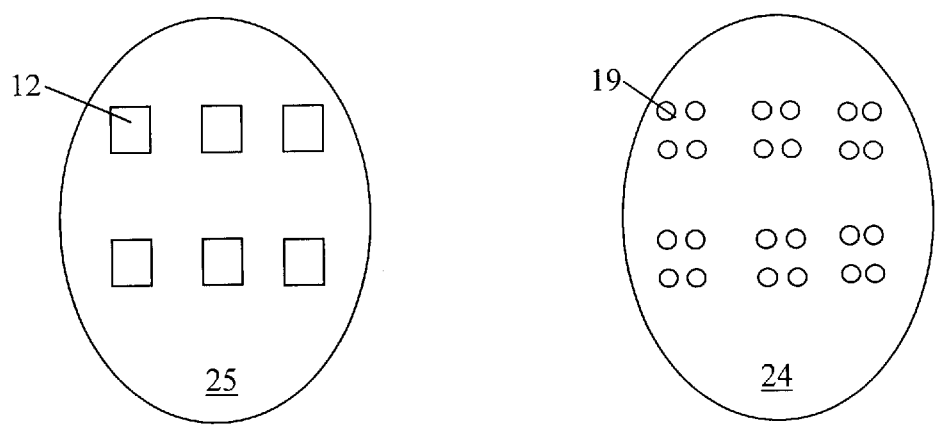
FIG. 4 illustrates a sacrificial wafer having defined MEMS structural elements and a glass wafer prepared having anchor means for supporting the defined MEMS structural elements.

Refer now to FIG. 4 where a sacrificial wafer 25 and a glass wafer 24 are illustrated. Glass wafer 24 is processed to provide pedestals 19, trenches and a metal layer (not shown). Since each wafer 24 is large enough to provide a plurality of substrates 14, wafer 24 will be laser scribed to aid in separating the MEMS devices at the end of the processing steps. Although not shown in FIG. 4, wafer 24 will also include electrodes and metal conductors in addition to pedestals 19.

Sacrificial wafer 25 has a doped epi layer on the upward facing surface in which a plurality of structural elements 12 is defined using known lithographic techniques. A portion of the sacrificial silicon substrate is removed using wet etch of potassium hydroxide (KOH) or backside grind to get to a desired thickness. A combination of both back-side grinding and wet etching may also be used to thin the sacrificial substrate. Preferably, structural elements 12 are not yet released from the remaining sacrificial portion of wafer 25.

Figure 5:
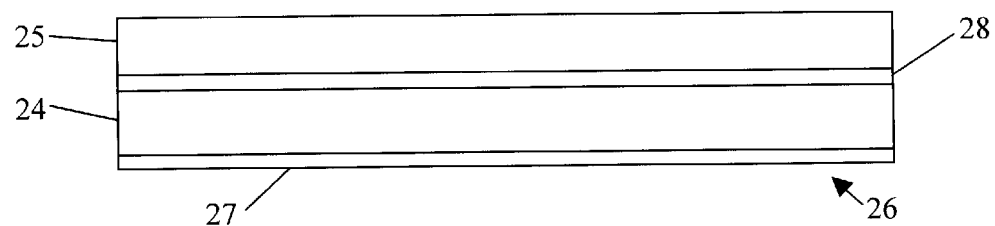
FIG. 5 shows a composite structure obtained by combining the sacrificial and glass wafers shown in FIG. 4.

FIG. 5 illustrates a side view of composite structure 26. Wafer 24 is then aligned with wafer 25 and bonded to form a composite structure 26. Composite structure 26 comprises backside metal layer 27, glass wafer 24, an epi layer 28 that is about 5–20 $\mu$m thick and sacrificial wafer 25. Anodic bonding is one preferred bonding method for forming the composite structure 26. Torsion beams 23 of the MEMS device are fused to pedestals 19 by the bonding process. Once bonded, composite structure 26 must be further processed to remove the remaining sacrificial portion of wafer 25. Enough of the sacrificial portion must be removed so as to release structural elements 12. One preferred dissolution process in accordance with the present invention is described in conjunction with FIG. 7.

Figures 6A, 6B:
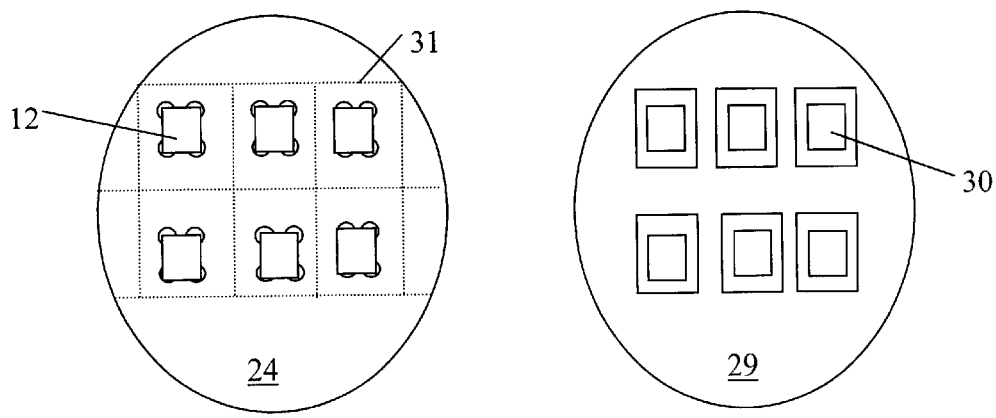
FIGS. 6A and 6B show a second glass wafer having recessed domes for encapsulating the MEMS device.

Referring now to FIG. 6A, with the sacrificial wafer 25 removed, structural elements 12 remain bonded to the top of supporting pedestals 19. Prior to separating the individual devices 16 along scribe lines 31, each device may be encapsulated with a dust cap or other encapsulating structure. One possible means for encapsulating the MEMS device is shown in FIG. 6B, where a glass wafer 29 is etched to define a plurality of depressions 30. The depressions are positioned so that when wafer 29 is aligned with wafer 24, depressions are aligned over respective MEMS devices on wafer 24. The dimension of each depression 30 must be sufficient to encompass structural element 12 in terms of height, length and width. Again, standard lithographic and etching techniques well known in the semiconductor arts are employed to etch depressions 30. Wafer 29 is also laser scribed to enable the caps to be readily separated. A second composite structure is obtained by anodically bonding wafer 29 to wafer 24 and a vacuum may be pulled within the resulting cavity, if required by a particular application. Since the second composite structure contains many individual MEMS devices, the devices must be separated by either sawing or dicing the wafer along scribe lines 31. The backside metal 27 facilitates the attachment of the MEMS device to a system level substrate such as a circuit board or a hybrid substrate or hermetic package. Electrical connection is made to the MEMS device by bonding wire leads to metal pads or traces that extend from the cavity region.

Figure 7:
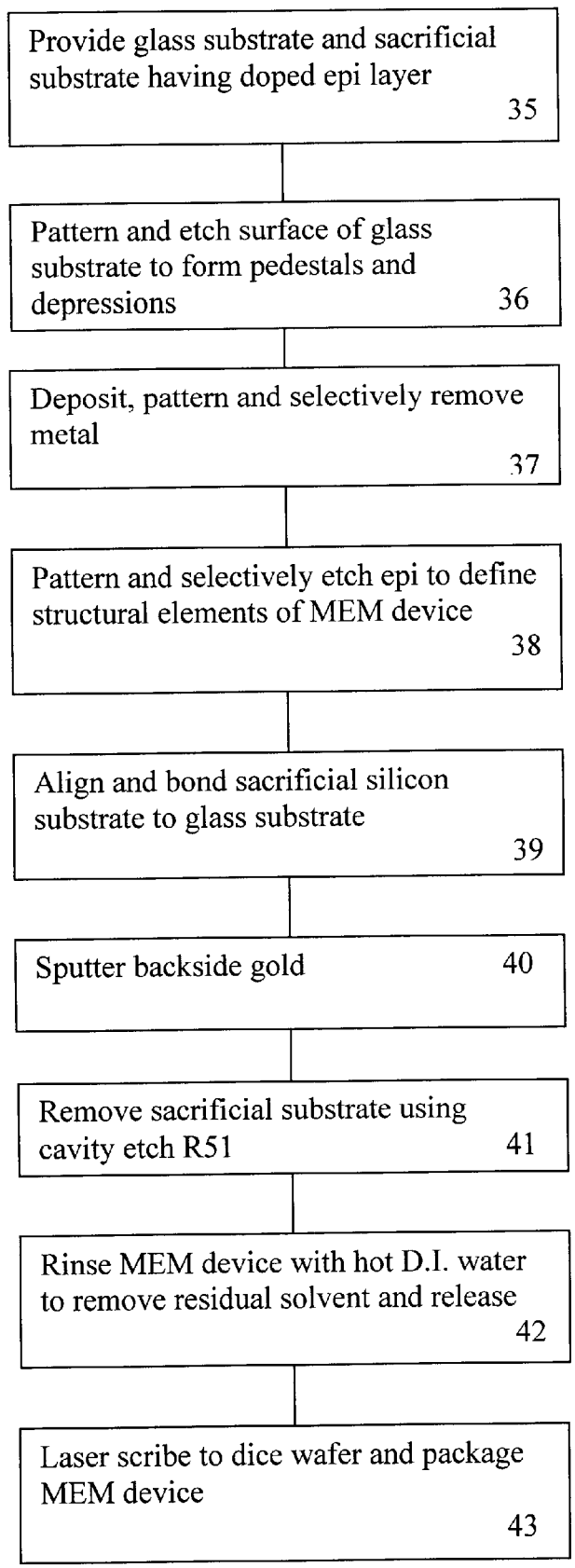
FIG. 7 is a flow diagram of one embodiment of the manufacturing process for manufacturing the MEMS device in accordance with the present invention.

Referring now to FIG. 7, a flow diagram of the manufacturing process of the present invention for manufacturing a MEMS device such as the one illustrated in FIGS. 2 and 3 is shown. Initially, glass wafer 24 and wafer 25 are provided as indicated at step 35 and processed using well understood lithographic processing techniques to pattern and etch various features onto at least one surface of each substrate. Since wafer 24 will form the base of the MEMS device, mesas and trenches are etched into one surface at step 36. These relief features may be etched using either wet or dry etching techniques. Wafer 25 has a doped epi layer in which the structural elements are will be defined and a sacrificial portion that will be removed once the composite structure is formed. The sacrificial portion refers to the non-epi bulk silicon portion of wafer 25. Wafer 25 may be thinned to minimize the amount of sacrificial silicon that must be etched during subsequent steps when releasing the structural elements. As is understood in the art, the wafers should be cleaned and inspected after each processing step.

At step 37, metal is deposited and patterned as required by a particular application on wafer 24. In one preferred embodiment, deposited metal comprises a first layer of titanium, which bonds well to Pyrex glass wafers, a second layer of platinum and a final layer of gold. For the MEMS device shown in FIGS. 2 and 3, the metal will be patterned to form electrodes and conductive traces, it being understood that the specific metalization pattern is deemed to be an engineering parameter dependant on each particular application. Further, specific detail regarding the preparation of the glass substrate is not described in detail herein as such process steps are well known in the semiconductor processing arts or are readily determinable and are largely dependent on the particular design of the MEMS device 16.

In the preferred embodiment, the sacrificial wafer comprises a boron doped epi layer grown on one surface of a (100) silicon wafer. The epi layer could be doped with other dopants, such as boron germanium, by way of example. The epi layer is preferably in the range of 5–25 microns thick with the actual thickness determined by the particular application. In step 38, wafer 25 is patterned and etched to define the MEMS structural elements in the doped epi layer. Although various etching techniques are known in the semiconductor arts, plasma etching readily forms deep vertical cuts through the epi layer. The sacrificial portion refers to. Metal may also be deposited on epi layer of wafer 25 at step 38, if required by a particular application.

In step 39, wafer 25 is aligned and bonded to wafer 24 to form a composite structure. Anodic bonding is the preferred bonding technique to join MEMS structural elements at the pedestals of wafer 24 and around the periphery of the composite structure. Anodic bonding is a process where the composite structure is placed in an alignment frame and heated in a vacuum to form a thermal bond between juxtaposed elements with voltage applied across the structure to fuse the elements together. After bonding, wafer 25 may be thinned using a wet chemical etch or backside wafer grind process.

In step 40, a backside metal layer, for example a layer of gold is sputtered onto the backside of glass substrate 24 to aid in the attachment of MEMS device 16 to a circuit board or hybrid substrate.

In step 41, sacrificial wafer 25 is removed in a dissolution etch to release the MEMS structure. The etch method of the present invention uses a commercially available organic solvent comprising a pre-mixed product containing a variation of an entirely different mixture, commonly referred to as Cavity Etch R51 and available from the Microelectronic Materials Division of Mallenkrodt-Baker, Inc. under product code number 6909. Cavity Etch R51 is a mixture of ethylene diamine, cathecol, pyrogallol (or pyrogallolic acid) and water. As with EDP, the R51 solvent etches the doped epi at a rate that is slower than the etch rate of undoped silicon by about an order of magnitude. At the conclusion of the etch process, the sacrificial silicon substrate is removed and the structural elements of MEMS device formed in the epi layer are thereby released but now the structural elements are attached to the Pyrex wafer.

The pre-mixed solvent is loaded into a spray acid processing tool. One preferred tool is the SAT1081D(0A1T) available from Semitool, Inc. This tool is a microprocessor controlled wet etching environment having an integrated spin rinse cleaning cycle for rinsing silicon wafers upon completion of the etch process. This arrangement minimizes the time between the end of the etch process and the beginning of the rinse process.

Composite structures are batch loaded in a cassette in a spaced apart arrangement. The cassette is attached by a fixture to a rotor inside a [stainless steel is etched by EDP, etc.] Teflon-lined spray chamber of the tool. The chamber has Teflon or nylon spray nozzles coupled to a reservoir where the R51 solvent is pre-heated to about 100° C. and then pumped into the spray chamber while the cassette is rotating. The spray should have a flow rate sufficient to maintain a thin coat (or meniscus) of solvent over the composite structures loaded into the cassettes. In this manner, the composite structures are continuously exposed to active solvent so the etch rate is constant and uniform.

In one experiment, 9.2 liters of R51 etchant was maintained at about 100 degree and the cassette was rotated at about 30 RPM for about 62.5 minutes to completely eliminate the sacrificial wafers from twenty-five composite structures. Advantageously, with the present invention, the etch process is between two and three times faster than the prior art immersion dissolution process using EDP as the solvent.

Still another advantage is that visual observation of the progress of the etch process is possible since the opacity of the spray is much less than that of a vat of EDP solvent. Visual observation permits the operator to visually monitor and detect the endpoint of the etch process through a window of the tool. As should be apparent, at the start of the etch process the composite structure is opaque because the silicon wafer is opaque. However, as the etch process progresses, the silicon wafer is eventually removed. At that point, the operator can observe that the composite structures are transparent, an indication that the transparent Pyrex wafer is and the structural elements of the MEMS device remain while the opaque silicon wafer is removed.

In contrast to the batch method, the present invention does not incur the non-uniformity etch rate caused by progressively etching batches of wafers in a vat of solvent. Further, with the present invention, the operator does not need to mix the components of the solvent since it is pre-mixed by the supplier. Further still, no agitation of the solvent is required and no fumes are generated to which the operator may be exposed. It should be apparent to one skilled in the art that the batch etch process of the prior art required a certain number of liters of cavity tchant to remove an approximate amount of cubic millimeters of silicon after which the etch rate rapidly declines. With this batch process characterization as to how well the solvent was etching the wafers was difficult to obtain and prone to error.

After the wafers have been completely etched, the chamber is purged of the solvent and a hot DI water reservoir is coupled to the spray nozzles. The wafers are then immediately rinsed in heated de-ionized water as indicated at step 42. Advantageously, the suspended structural elements of the MEMS device are already released so no heated release step is required. Further, electrode 13 does not require the stand-off element.

In step 51, the MEMS device is laser scribed to dice the wafers with the individual MEMS devices packaged in accordance with its application requirement. If required by the application, the MEMS device may be encapsulated and the resulting cavity may be evacuated to provide a vacuum surrounding the suspended structural element.

Although the invention has been described herein with reference to a specific embodiment, many modifications and variations therein will readily occur to those skilled in the art. Accordingly, it is intended that the invention may be embodied in other specific forms without departing from its spirit or essential characteristics. The described embodiments are to be considered in all respects only as illustrative and not restrictive as the scope of the invention is indicated by the appended claims.

What is claimed is:

1. A process for manufacturing a micro electromechanical system (MEMS) device comprising the steps of:
   Defining structural elements of said MEMS device in a first substrate, said first substrate having a sacrificial portion;
   Preparing a second substrate for supporting said structural elements of saidA MEMS device;
   Aligning said first and second substrates;
   Bonding said first and second substrates to form a composite structure;
   Removing said sacrificial portion of said first substrate to release the structural elements of said MEMS device by spraying an etchant on said composite structure while said composite structure is rotated in a chamber;
   Monitoring the rate of removal to determine completion of said removing step; and
   Cleaning said composite structure by spraying heated de-ionized water on said composite structure while said composite structure continues to rotate in said chamber.

2. The process of claim 1 wherein said second substrates comprises a glass substrate.

3. The process of claim 1 wherein said removing step further comprises the step of removing at least a portion of said sacrificial portion of said substrate prior to said etchant spraying.

4. The process of claim 1 wherein said removing step further comprises the steps of:
   Heating a reservoir of solvent;
   Pumping said solvent through at least one nozzle to create within said chamber a spray of solvent sufficient to provide sheeting of said solvent on said composite structure;
   Maintaining the rate of pumping such that the opacity of said solvent on said composite structure is optically transparent; and
   Terminating the pumping step upon removal of said sacrificial portion of said first substrate.

5. The process of claim 4 wherein said heating step comprises the step of heating a mixture of ethylene diamine, cathecol, pyrogallol and water.

6. The process of claim 4 wherein said heating step comprises the step of heating a mixture of ethylene diamine, cathecol, pyrogallolic acid and water.

7. The process of claim 1 wherein said cleaning step further comprises the steps of:
   Heating said de-ionized water in a second reservoir prior to said cleaning step; and
   Evaporating residual de-ionized water from said MEMS device.

8. The process of claim 1 wherein preparing said second substrate step includes the steps of:
   Defining means in one surface of said second substrate for supporting said structural elements offset from but in proximity to said second substrate;
   Defining means in said surface of said second substrate for depositing metal such that the height of said metal is substantially flush with said surface of said second substrate;
   Depositing a layer of metal on said surface; and
   Patterning said layer of metal such that said layer of metal is substantially uniform.

9. The process of claim 8 wherein said preparing said second substrate step further includes the step of depositing a backside layer of metal on said second substrate.

10. The process of claim 8 wherein said structural elements of said MEMS device includes a suspended element aligned over said patterned layer of metal.

11. The process of claim 1 wherein said bonding step comprises the step of anodically bonding said first substrate to said second substrate.

12. A process for manufacturing a micro electromechanical system device wherein a suspended structural element, attached to a sacrificial substrate, is coupled to a support substrate, the manufacturing process for releasing the suspended structural element from the sacrificial substrate comprising the steps of:
   Positioning at least one composite structure having a sacrificial wafer bonded to a support wafer in a carrier, said carrier positioned in a chamber having a plurality of spray nozzles;
   Rotating said carrier;
   Spraying a etchant from said spray nozzles to form a meniscus of etchant on said composite structure, said etchant comprising a solvent for dissolution of said sacrificial wafer;
   Monitoring the rate of dissolution of said sacrificial wafer to determine when said suspended structural element is released from said sacrificial wafer; and
   Cleaning said composite structure by spraying heated de-ionized water on said composite structure while said carrier continues to rotate in said chamber.

13. The process of claim 12 wherein said monitoring includes the steps of:
   Maintaining the meniscus of said etchant on said composite structure such that the opacity of said etchant does not impair visual observation of the rate of dissolution of said sacrificial wafer; and
   Visually monitoring the rate of dissolution of said sacrificial wafer.

14. The process of claim 12 wherein said sacrificial wafer comprises a silicon wafer having a doped epi layer, the etchant spraying step further including the steps of:

Heating a reservoir of solvent;

Pumping said solvent through said nozzle to create within said chamber a spray of solvent sufficient to provide sheeting of said solvent on said composite structure;

Maintaining the rate of pumping such that the opacity of said solvent on said composite structure is optically transparent; and Terminating the pumping step upon removal of at least a portion of said sacrificial wafer sufficient to release said suspended structural element.

15. The process of claim 14 wherein said heating step comprises the step of heating a mixture of ethylene diamine, cathecol, pyrogallol and water.

16. The process of claim 14 wherein said heating step comprises the step of heating a mixture of ethylene diamine, cathecol, pyrogallolic acid and water.

17. The process of claim 12 wherein said cleaning step further comprises the steps of:

Heating said de-ionized water in a second reservoir prior to said cleaning step;

Spraying said heated de-ionized water on said carrier is rotating in said chamber upon termination of the etchant spray; and Evaporating residual de-ionized water from said MEMS device.

18. The process of claim 12 wherein said spraying step comprises the steps of:

Heating a reservoir containing a mixture of ethylene diamine, cathecol, pyrogallol and water; and Pumping said mixture through said nozzles onto said composite structure.

19. The process of claim 12 wherein said spraying step comprises the steps of:

Heating a reservoir containing a mixture of ethylene diamine, cathecol, pyrogallolic acid and water; and Pumping said mixture through said nozzles onto said composite structure.

20. The process of claim 12 wherein said cleaning step further comprises the steps of:

Heating said de-ionized water in a second reservoir prior to said cleaning step;

Pumping said heated de-ionized water on said composite structure while said cassette is rotating in said chamber; and Evaporating residual de-ionized water from said MEMS device.

21. The process of claim 12 wherein said cleaning step further comprises the step of pumping said heated de-ionized water immediately upon termination of said pumping step.

* * * * *